United States Patent
Miyake et al.

(10) Patent No.: US 9,947,798 B2
(45) Date of Patent: Apr. 17, 2018

(54) DISPLAY DEVICE

(71) Applicant: Japan Display Inc., Minato-ku (JP)

(72) Inventors: Hidekazu Miyake, Tokyo (JP); Arichika Ishida, Tokyo (JP); Norihiro Uemura, Tokyo (JP); Hiroto Miyake, Tokyo (JP); Isao Suzumura, Tokyo (JP); Yohei Yamaguchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 69 days.

(21) Appl. No.: 14/804,395

(22) Filed: Jul. 21, 2015

(65) Prior Publication Data

US 2016/0027921 A1 Jan. 28, 2016

(30) Foreign Application Priority Data

Jul. 23, 2014 (JP) .................................. 2014-149668

(51) Int. Cl.
| | | |
|---|---|---|
| *G02F 1/136* | (2006.01) | |
| *H01L 29/786* | (2006.01) | |
| *H01L 27/12* | (2006.01) | |
| *H01L 29/24* | (2006.01) | |
| *H01L 29/66* | (2006.01) | |
| *G02F 1/1368* | (2006.01) | |

(52) U.S. Cl.
CPC ...... *H01L 29/7869* (2013.01); *H01L 27/1218* (2013.01); *H01L 27/1225* (2013.01);
(Continued)

(58) Field of Classification Search
CPC ............. H01L 29/7869; H01L 27/1218; H01L 27/1225; H01L 29/24; H01L 29/66969;
(Continued)

(56) References Cited

U.S. PATENT DOCUMENTS 8,310,612 B2 * 11/2012 Cho .................. G02F 1/136227
 349/138
2011/0079784 A1 * 4/2011 Im ....................... H01L 27/3262
 257/59

(Continued)

FOREIGN PATENT DOCUMENTS

| CN | 101051134 A | 10/2007 |
|---|---|---|
| CN | 103081108 A | 5/2013 |

(Continued)

OTHER PUBLICATIONS

Korean Office Action dated Dec. 19, 2016 in Patent Application No. 10-2015-0102446 (with English translation).

(Continued)

*Primary Examiner* — Charles Chang
(74) *Attorney, Agent, or Firm* — Oblon, McClelland, Maier & Neustadt, L.L.P.

(57) ABSTRACT

According to one embodiment, a display device includes thin-film transistor. The thin-film transistor includes a first semiconductor layer, a first insulating film, a gate electrode, a second insulating film, a second semiconductor layer, a first electrode and a second electrode. The gap between the bottom surface of the gate electrode and the upper surface of the first channel region of the first semiconductor layer is larger than the gap between the upper surface of the gate electrode and the bottom surface of the second channel region of the second semiconductor layer.

20 Claims, 5 Drawing Sheets

(52) U.S. Cl.
CPC ........ *H01L 29/24* (2013.01); *H01L 29/66969* (2013.01); *H01L 29/78696* (2013.01); *G02F 1/1368* (2013.01); *G02F 2001/13685* (2013.01); *G02F 2202/104* (2013.01)

(58) Field of Classification Search
CPC ............. H01L 29/78696; G02F 1/1368; G02F 2001/13685; G02F 2202/104
USPC .......................................................... 349/47
See application file for complete search history.

(56) References Cited

U.S. PATENT DOCUMENTS

| | | |
|---|---|---|
| 2011/0220898 A1 | 9/2011 | Yoon et al. |
| 2012/0019753 A1* | 1/2012 | Mitsumoto ......... G02F 1/13363 349/118 |
| 2012/0286260 A1 | 11/2012 | Noda et al. |

FOREIGN PATENT DOCUMENTS

| | | | |
|---|---|---|---|
| JP | 5-95116 A | 4/1993 | |
| JP | H05-095116 A * | 5/1993 | ........... H01L 29/784 |
| JP | 3061907 | 7/2000 | |
| JP | 2007-298976 A | 11/2007 | |
| JP | 2012-27204 A | 2/2012 | |
| JP | 2012-104566 A | 5/2012 | |
| JP | 2012-129307 | 7/2012 | |
| JP | 2013-145878 | 7/2013 | |
| JP | 2014-103142 | 8/2014 | |
| KR | 10-2011-0037220 A | 4/2011 | |
| KR | 10-2014-0014759 A | 2/2014 | |

OTHER PUBLICATIONS

Japanese Office Action dated Feb. 20, 2018, issued in Japanese Patent Application No. 2014-149688 (with English translation).
Chinese Office Action dated Nov. 28, 2017 in Chinese Application No. 201510408263.0 (with English Translation).

* cited by examiner

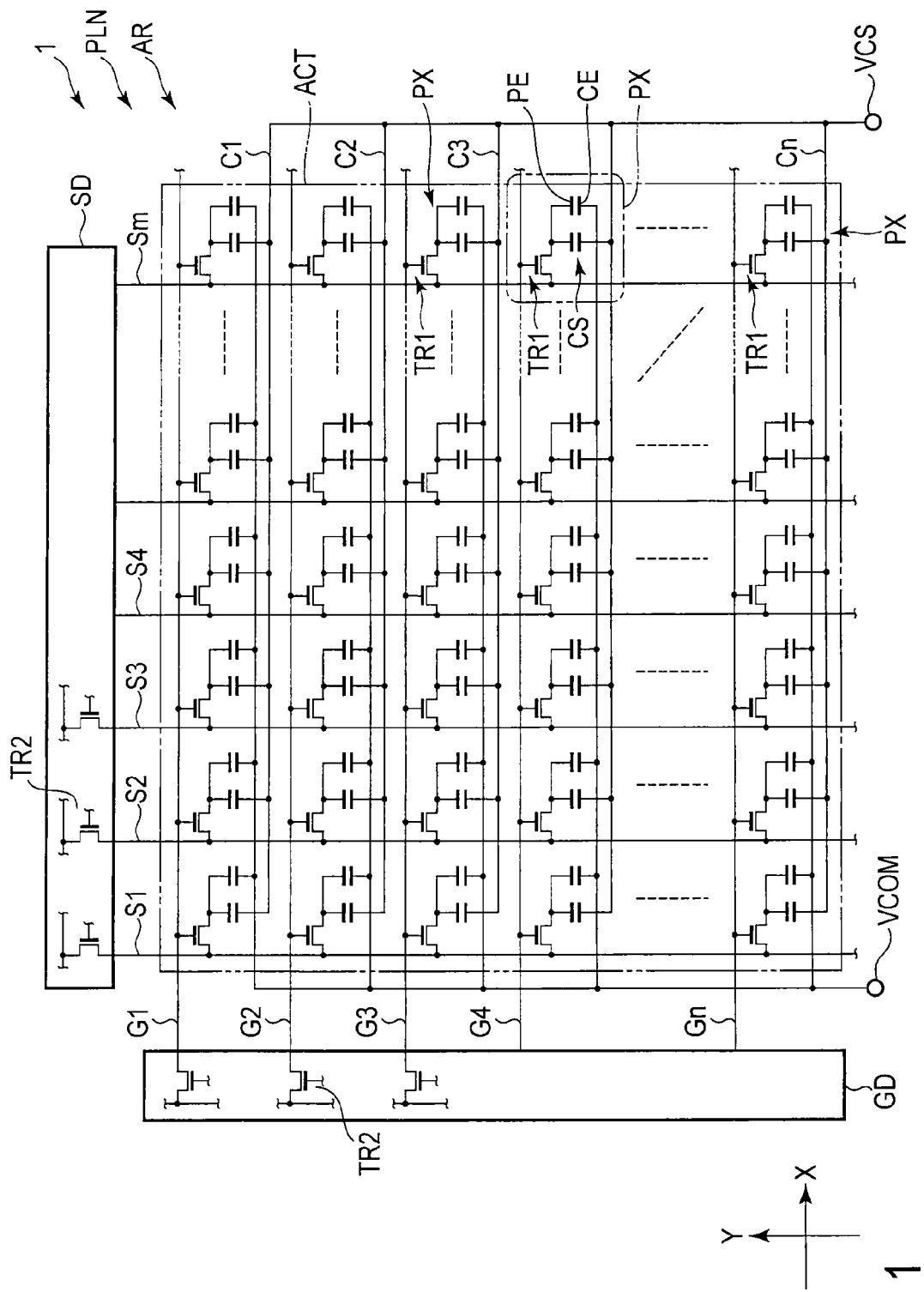
F I G. 1

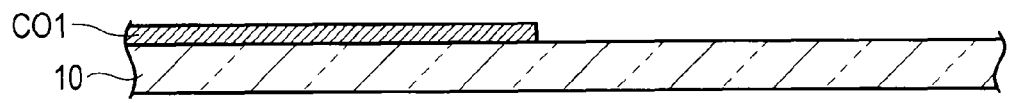
F I G. 4
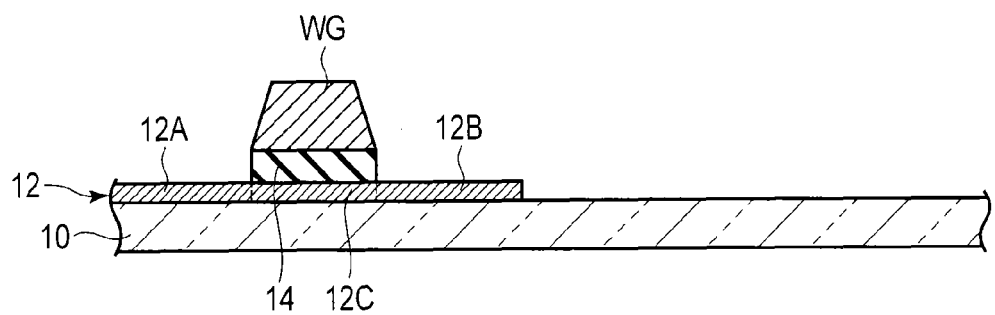
F I G. 5
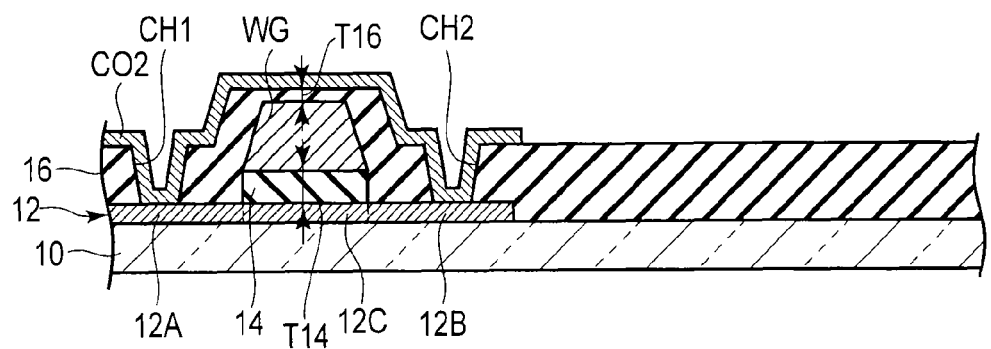
F I G. 6

DISPLAY DEVICE

CROSS-REFERENCE TO RELATED APPLICATIONS

This application is based upon and claims the benefit of priority from Japanese Patent Application No. 2014-149668, filed Jul. 23, 2014, the entire contents of which are incorporated herein by reference.

FIELD

Embodiments described herein relate generally to a display device.

BACKGROUND

Active-matrix display devices employ thin-film transistors (TFTs) used as the switching elements of pixels. Further, thin-film transistors are used also for switching elements of drivers formed in a frame area (non-displaying area) located on an outer side of an active area (display area).

Moreover, for these TFTs, a TFT of a double-channel structure type has been proposed, which aims to increase the on-state current. A TFT of this type comprises a first amorphous silicon film, a second amorphous silicon film located above the first amorphous silicon film so as to oppose the first amorphous silicon film, and a gate electrode interposed between the first amorphous silicon film and the second amorphous silicon film. That is, the TFT includes two amorphous silicon films. Further, with the above-described structure, the occupying area of the TFT can be reduced as compared to the case where the first amorphous silicon film and the second amorphous silicon film are formed in layers of the same level.

BRIEF DESCRIPTION OF THE DRAWINGS

FIG. 1 is an exemplary plan view briefly depicting a configuration and equivalent circuit of a display device according to an embodiment.

FIG. 4 is a schematic exemplary sectional view illustrating a method of manufacturing the thin-film transistor shown in FIG. 2.

FIG. 5 is a schematic exemplary sectional view illustrating the method of manufacturing the thin-film transistor in subsequence to FIG. 4.

FIG. 6 is a schematic exemplary sectional view illustrating the method of manufacturing the thin-film transistor in subsequence to FIG. 5.

DETAILED DESCRIPTION

Figure 2:
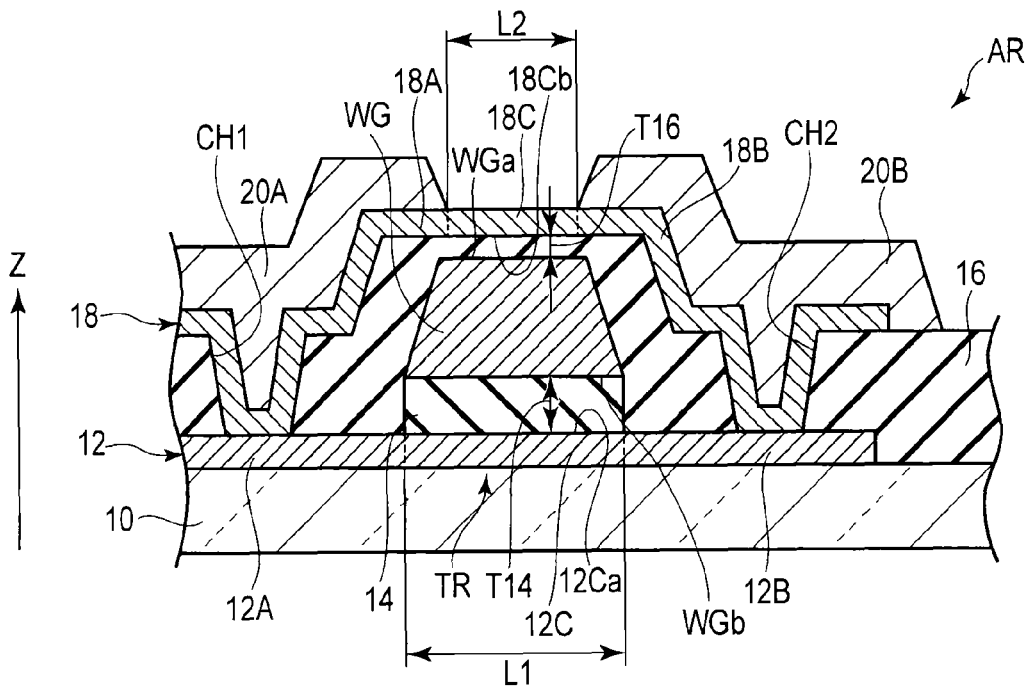
FIG. 2 is a schematic exemplary sectional view depicting a portion of the display device, FIG. 2 being a view illustrating a thin-film transistor thereof.

In general, according to one embodiment, there is provided a display device comprising thin-film transistor, the thin-film transistor comprising: a first semiconductor layer including a first region, a second region and a first channel region located between the first region and the second region; a first insulating film formed on the first channel region of the first semiconductor layer; a gate electrode formed on the first insulating film to oppose the first channel region; a second insulating film formed on the gate electrode; a second semiconductor layer formed on the second insulating film to oppose the first semiconductor layer, and including a third region electrically connected to the first region, a fourth region electrically connected to the second region and a second channel region located between the third region and the fourth region to oppose the a gate electrode; a first electrode located above the second semiconductor layer and contacting with the third region; and a second electrode located above the second semiconductor layer, separated from the first electrode and contacting with the fourth region, wherein a gap between a bottom surface of the gate electrode and an upper surface of the first channel region, which oppose to each other, is larger than a gap between an upper surface of the gate electrode and a bottom surface of the second channel region, which oppose to each other.

According to another embodiment, there is provided a display device comprising thin-film transistor, the thin-film transistor comprising: a first semiconductor layer including a first region, a second region and a first channel region located between the first region and the second region; a first insulating film formed on the first channel region of the first semiconductor layer; a gate electrode formed on the first insulating film to oppose the first channel region; a second insulating film formed on the gate electrode; a second semiconductor layer formed on the second insulating film to oppose the first semiconductor layer, and including a third region electrically connected to the first region, a fourth region electrically connected to the second region and a second channel region located between the third region and the fourth region to oppose the gate electrode; a first electrode located above the second semiconductor layer and contacting with the third region; and a second electrode located above the second semiconductor layer, separated from the first electrode and contacting with the fourth region, wherein the gate electrode comprises a bottom surface opposing the first channel region, and an upper surface opposing the second channel region and having an area smaller than that of the bottom surface, and is formed into a forward tapered shape.

Embodiments will now be described with reference to accompanying drawings. Note that the disclosure is presented for the sake of exemplification, and any modification and variation conceived within the scope and spirit of the embodiments by a person having ordinary skill in the art are naturally encompassed in the scope of embodiment of the present application. Furthermore, a width, thickness, shape, and the like of each element are depicted schematically in the figures as compared to actual embodiments for the sake of simpler explanation, and they do not limit the interpretation of the present embodiments. Furthermore, in the description and figures of the present application, structural elements having the same or similar functions will be referred to by the same reference numbers and detailed explanations of them that are considered redundant may be omitted.

FIG. 1 is an exemplary plan view briefly depicting a configuration and equivalent circuit of a display device according to an embodiment. Here, as the display device comprising thin-film transistors, a liquid crystal display device will be described, but note that it is only an example of the application of the embodiment.

As shown in FIG. 1, a display device 1 comprises an active area (display area) ACT configured to display images and a frame area (non-display area) on an outer side of the active area ACT. The display device 1 comprises a liquid crystal display panel PLN. The liquid crystal display panel PLN comprises an array substrate AR, a counter-substrate and a liquid crystal layer, which will be described later. The array substrate AR comprises, in the active area ACT, an n-number of gate lines G (G1 to Gn), an n-number of auxiliary capacitance lines C (C1 to Cn), an m-number of source lines S (S1 to Sm) and pixels PX arranged in a matrix of m×n. Each pixel PX is defined by two adjacent source lines S and two adjacent gate lines G.

The gate lines G and the auxiliary capacitance lines C are extended substantially parallel to a first direction X. Note that the gate lines G and the auxiliary capacitance lines C are not necessarily extended linearly. The gate lines G and the auxiliary capacitance lines C are arranged alternately in a second direction Y. The source lines S are extended substantially parallel to the second direction Y. The source lines S are substantially orthogonal to the gate lines G and the auxiliary capacitance lines C. Note that the source lines S are not necessarily extended linearly. The gate lines G, the auxiliary capacitance lines C and the source lines S may be partly crooked. The gate lines G, the source lines S and the auxiliary capacitance lines C are formed of, for example, molybdenum, chromium, tungsten, aluminum, copper, titanium, nickel, tantalum, silver or an alloy of any of these, but the materials are not particularly limited to these. They may be formed of other metals and alloys or multilayered films.

Each gate line G is extended to an exterior of the active area ACT and connected to a gate driver GD. Each source line S is extended to the exterior of the active area ACT and connected to a source driver SD. Each auxiliary capacitance line C is extended to the exterior of the active area ACT and is electrically connected to a voltage applying unit VCS to which an auxiliary capacity voltage is applied.

Each pixel PX comprises a first thin-film transistor TR1, a pixel electrode PE, a common electrode CE and a storage capacitance CS. Each pixel electrode PE is electrically connected to a respective source line S via a respective first thin-film transistor TR1. The common electrode CE opposes the pixel electrode PE. The common electrode CE is electrically connected to the power supply module VCOM provided outside the active area ACT. The storage capacitance CS is electrically connected to the pixel electrode PE.

The first thin-film transistor TR1 is switched between a conductive state (ON) and a non-conductive state (OFF) by a control signal supplied from the gate driver GD via the respective gate line G. A video signal output from the source driver SD is supplied to the respective pixel electrode PE via the source line S and the first thin-film transistor TR1 in the conductive state. Because of the potential difference between the common electrode CE set at a common potential and the pixel electrode PE, a voltage applied to the respective liquid crystal layer is controlled.

The storage capacitance CS is configured to hold the voltage applied to a liquid crystal layer for a fixed period, and is formed of a pair of electrodes opposing each other via an insulating film. For example, in the storage capacitance CS, one electrode is a part of an auxiliary capacitance line C or an auxiliary electrode electrically connected to the auxiliary capacitance line C, and the other electrode is an auxiliary counter electrode connected to the respective pixel electrode PE.

The gate driver GD and the source driver SD are formed in the frame area. The gate driver GD and the source driver SD each comprise second thin-film transistors TR2 configured to function as switching elements.

FIG. 2 is a sectional view briefly showing a part of the display devices 1 (array substrate AR) according to the embodiment, which is the thin-film transistor TR. Here, only the essential parts of the array substrate AR, required for descriptions are illustrated.

At least one of the first thin-film transistor TR1 and the second thin-film transistor TR2 shown in FIG. 1 is formed of the thin-film transistor TR shown in FIG. 2. In this embodiment, both the first thin-film transistor TR1 and the second thin-film transistor TR2 mentioned above are formed of the thin-film transistor TR.

As shown in FIG. 2, the thin-film transistor TR is formed above the main surface of a first insulating substrate 10 of the array substrate AR, and configured to function as a switching element. The thin-film transistor TR comprises a first semiconductor layer 12, a first insulating film 14, a gate electrode WG, a second insulating film 16, a second semiconductor layer 18 and low-resistance wirings 20A and 20B.

The first insulating substrate 10 is formed of a material having light transmissivity and insulating property, such as glass or resin. A base protective film (insulating film) may be formed on the first insulating substrate 10 so as to, for example, planarize the main surface of the first insulating substrate 10 and to prevent diffusion of impurities from the first insulating substrate. Here, the main surface of the first insulating substrate 10 is a plane parallel to the X-Y plane defined by the first direction X and the second direction Y, orthogonal to each other. A third direction Z is a normal direction to the main surface of the first insulating substrate 10 and is perpendicular to each of the first direction X and the second direction Y.

The first semiconductor layer 12 is formed above the main surface of the first insulating substrate 10. Therefore, the first semiconductor layer 12 may be in contact with the main surface of the first insulating substrate 10, or may be located to be separate from the main surface. In the case of the latter, the base protective film is interposed between the main surface and the first semiconductor layer 12. The first semiconductor layer 12 comprises a first region 12A, a second region 12B and a first channel region 12C. The first channel region 12C is located between the first region 12A and the second region 12B in the direction along the main surface of the first insulating substrate 10. The first channel region 12C comprises an upper surface 12Ca opposing the gate electrode WG. One of the first or the second regions 12A and 12B function as a source region, and the other of the first and the second regions 12A and 12B functions as a drain region. The resistance of the first region 12A and the second region 12B are set lower as compared to that of the first channel region 12C. The first semiconductor layer 12 and the second semiconductor layer 18 are formed of semiconductors such as amorphous silicon, polycrystalline silicon, an organic semiconductor, and an oxide semiconductor. In this embodiment, the first semiconductor layer 12 and the second semiconductor layer 18 are formed of an oxide semiconductor.

The first insulating film 14 is formed at least on the first channel region 12C. In this embodiment, the first insulating film 14 is formed only on the first channel region 12C. Since the first insulating film 14 and the second insulating film 16 each function as a gate insulating film, it is desirable that they be formed thin and of an inorganic material with which such a defect as short-circuiting does not easily occur. Examples of such an inorganic material are a silicon oxide and silicon nitride, but they are not particularly be limited. Oxides of aluminum, hafnium and yttrium, and multilayered films of these may as well be employed.

Here, the first channel region 12C is a superimposed area on which the first insulating film 14 is superimposed. The first region 12A and the second region 12B are non-superimposed areas off from the first insulating film 14. The first region 12A and the second region 12B have a reducible element concentration higher than that of the first channel region 12C.

The gate electrode WG is formed on the first insulating film 14. The gate electrode WG comprises a bottom surface WGb opposing the upper surface 12Ca of the first channel region 12C, and an upper surface WGa opposing the second semiconductor layer 18. One side of the bottom surface WGb opposes the boundary between the first region 12A and the first channel region 12C in the third direction Z, and another side of the bottom surface WGb opposes the boundary between the second region 12B and the first channel region 12C in the third direction Z. That is, a first channel length L1 of the first channel region 12C is equivalent to the distance between a pair of opposing sides of the bottom surface WGb. The gate electrode WG is formed into a forward tapered shape. The gate electrode WG is electrically connected to a gate line G in the region which is not illustrated. For example, the gate electrode WG and the gate line G may be formed in a layer of the same level, of the same material integrally as one body.

The second insulating film 16 is formed at least on the gate electrode WG. In this embodiment, the second insulating film 16 is formed on the first insulating substrate 10, the first semiconductor layer 12 and the gate electrode WG, so as to cover the sides of the insulating film 14. A first contact hole CH1 is formed in a region of the second insulating film 16, which opposes the first region 12A. Further, a second contact hole CH2 is formed in a region of the second insulating film 16, which opposes the second region 12B. The first contact hole CH1 and the second contact hole CH2 extend along the third direction Z all the way through the second insulating film 16. The first contact hole CH1 exposes a part of the first region 12A to the outside of the second insulating film 16, and the second contact hole CH2 exposes a part of the second region 12B to the outside of the second insulating film 16.

The second semiconductor layer 18 is formed on the second insulating film 16 and opposes the first semiconductor layer 12. The second semiconductor layer 18 comprises a third region 18A electrically connected to the first region 12A, a fourth region 18B electrically connected to the second region 12B and a second channel region 18C. In this embodiment, the third region 18A is in contact with the first region 12A through the first contact hole CH1. The fourth region 18B is in contact with the second region 12B through the second contact hole CH2. The second channel region 18C is located between the third region 18A and the fourth region 18B in the direction along the main surface of the first insulating substrate 10. The second channel region 18C comprises a bottom surface 18Cb opposing the upper surface WGa of the gate electrode WG. One of the third and fourth regions 18A and 18B functions as a source region and the other one of the third and fourth regions 18A and 18B functions as a drain region. In this embodiment, the first channel width of the first channel region 12C and the second channel width of the second channel region 18C are the same.

The low-resistance wiring 20A is located above the second semiconductor layer 18 and brought into contact with the third region 18A. In this embodiment, the low-resistance wiring 20A is formed on the second insulating film 16 and the second semiconductor layer 18. One end of the low-resistance wiring 20A opposes the upper surface WGa and also the boundary between the third region 18A and the second channel region 18C. The low-resistance wiring 20B is located above the second semiconductor layer 18 and brought into contact with the fourth region 18B. In this embodiment, one end of the low-resistance wiring 20B opposes the upper surface WGa and also the boundary between the fourth region 18B and the second channel region 18C. That is, a second channel length L2 of the second channel region 18C is equivalent to the distance from the end of the low-resistance wiring 20A to the opposing end of the low-resistance wiring 20B.

The low-resistance wiring 20A functions as a first electrode of the thin-film transistor TR, and the low-resistance wiring 20B functions as a second electrode of the thin-film transistor TR. One of the low-resistance wirings 20A and 20B functions as a source electrode, and the other one of the low-resistance wirings 20A and 20B functions as a drain electrode. For example, when the low-resistance wiring 20A functions as a source electrode, both the first region 12A and the third region 18A electrically connected to the low-resistance wiring 20A function as source regions.

In such a case, the low-resistance wiring 20B functions as a drain electrode, and both the second region 12B and the fourth region 18B electrically connected to the low-resistance wiring 20B function as drain regions. The gate electrode WG, the low-resistance wiring 20A and the low-resistance wiring 20B are formed of, for example, molybdenum, tungsten, aluminum, titanium, copper, as a metal, or an alloy of any of these metals.

As described above, the thin-film transistor TR takes the structure of a top-gate thin-film transistor by the first semiconductor layer 12 and the gate electrode WG, whereas takes the structure of a bottom-gate thin-film transistor by the second semiconductor layer 18 and the gate electrode WG. That is, the thin-film transistor TR of the embodiment is a thin-film transistor of a double-channel structure, in which a top-gate thin-film transistor and a bottom-gate thin-film transistor share the gate electrode WG. For example, if a gate voltage Vg more than a threshold voltage Vth of the thin-film transistor TR is applied to the gate electrode WG, a drain current Id starts to flow between the low-resistance wiring 20A and the low-resistance wiring 20B according to the potential difference between the low-resistance wiring 20A and the low-resistance wiring 20B. The drain current Id here is called on-state current.

In the embodiment, since the first semiconductor layer 12 and the second semiconductor layer 18 are connected in parallel, the drain current Id is the sum of a second drain current Id2 flowing in the second semiconductor layer 18 and a first drain current Id1 flowing in the first semiconductor layer 12. The first semiconductor layer 12 and the second semiconductor layer 18 are not formed side by side in a layer of the same level, but they are arranged to oppose the third direction Z. In the thin-film transistor TR of such a structure, a sufficient channel width can be secured while reducing the occupying area of the thin-film transistor TR. That is, the on-state current can be increased while reducing the occupying area of the thin-film transistor TR. Or the channel width can be increased without changing the occupying area of the thin-film transistor TR.

With application of such a thin-film transistor TR to the first thin-film transistor TR1, the aperture ratio of pixels PX can be improved. Further, with application the thin-film transistor TR to the second thin-film transistor TR2, the miniaturization (reduction of occupying area) of the source driver SD and the gate driver GD can be realized, contributing to the narrowing of the frame portion (reduction of a frame area).

The low-resistance wirings 20A and 20B are formed by patterning a metallic film formed on the second semiconductor layer 18. In the second semiconductor layer 18, a region not facing the low-resistance wirings 20A and 20B is the second channel region 18C. Therefore, the relative positions of the second channel region 18C and the gate electrode WG with respect to each other may be displaced by deviation of patterning. When an area of the bottom 18Cb which opposes the upper surface WGa is not constant, such thin-film transistors TR will produce variation in performance. In order to avoid this, one end of the low-resistance wiring 20A is placed to oppose the upper surface WGa and one end of the low-resistance wiring 20B is placed to oppose the upper surface WGa. With this structure, even if patterning deviates to a certain extent, the entire bottom surface 18Cb can be set to oppose the upper surface WGa. Therefore, according to this embodiment, the variation in performance among the thin-film transistors TR can be suppressed.

Moreover, in the embodiment, the gate electrode WG is formed into a forward tapered shape. That is, the first channel length L1 is longer than the second channel length L2 (L2<L1). As to such a structure, the threshold voltage Vth1 of the top-gate thin-film transistor formed from the first semiconductor layer 12, in many cases, shifts in a positive voltage direction as compared to the threshold voltage Vth2 of the bottom-gate thin-film transistor formed from the second semiconductor layer 18.

In order to avoid this, in this embodiment, a gap T14 between the upper surface 12Ca and the bottom surface WGb in a direction parallel to the third direction Z is set larger than a gap T16 between the upper surface WGa and the bottom surface 18Ca in a direction parallel to the third direction Z. If the value of the on-state current of the top-gate thin-film transistor formed from the first semiconductor layer 12 is higher than the value of the on-state current of the bottom-gate thin-film transistor formed from the second semiconductor layer 18, such a thin-film transistor TR will have hump characteristic and be difficult to handle because of its design. For this reason, a relationship of T16<T14 is defined as described above. Therefore, with the structure of the thin-film transistor TR of the embodiment, the variation in performance of the thin-film transistor TR can be suppressed.

Incidentally, the first drain current Id1 flows through a complicated path as compared to the second drain current Id2. When the first drain current Id1 flows through the second semiconductor layer 18 and the first semiconductor layer 12 in the third direction Z, the current is exposed to resistance. Further, contact resistance acts on the current while flowing through the interface between the second semiconductor layer 18 and the first semiconductor layer 12.

Therefore, the loss by resistance can be suppressed by establishing such a structure that the on-state current flows through the second semiconductor layer 18 preferentially.

The display device 1, in some cases, comprises a backlight unit. The backlight unit opposes an external surface opposite to the main surface of the first insulating substrate 10. In this case, the characteristics of the first semiconductor layer 12 may change in response to irradiation of the light from the backlight unit. An example of such a case is that the threshold voltage Vth shifts in a negative voltage direction due to the stress created when the gate bias voltage (negative bias) is applied, which makes the transistor non-conductive while light is being irradiated to the channel portion. This causes malfunction of the thin-film transistor TR. The first channel region 12C has a channel length longer than that of the second channel region 18C, and also the threshold voltage Vth is in a higher positive voltage side, its influence is small even if the voltage shifts in a negative direction to a certain extent. Moreover, in the second channel region 18C, the first semiconductor layer 12 and the gate electrode WG shield the light from the backlight unit, and therefore, even if the channel length is short, the negative shift of the threshold voltage Vth due to the optical leakage current described above does not occur easily. Therefore, with the structure that a pair of sides of the upper surface WGa opposes the bottom surface WGb, malfunction of the thin-film transistor TR can be suppressed.

It is desirable to form the first semiconductor layer 12 and the second semiconductor layer 18 of an oxide semiconductor. Preferable examples of such an oxide semiconductor are oxides containing at least one of indium, gallium and zinc. Typical examples of the oxide semiconductor are indium-gallium-zinc oxide (IGZO), indium-gallium oxide (IGO), indium-zinc oxide (IZO), zinc-tin oxide (ZnSnO) and zinc oxide (ZnO). The semiconductor layer formed from such an oxide semiconductor can realize high mobility as compared to the semiconductor layer formed from amorphous silicon.

Moreover, as compared to the semiconductor layer formed from polycrystalline silicon, the semiconductor layer of such an oxide semiconductor can be formed uniformly over a large area at low temperature, and therefore can reduce the manufacturing cost. In addition, by forming the first semiconductor layer 12 and the second semiconductor layer 18 from the same oxide semiconductors or oxide semiconductors of similar compositions, the contact resistance of the interface between the second region 12B and the fourth region 18B and the interface between the first region 12A and the third region 18A can be reduced. In above-mentioned oxide semiconductors, indium-gallium-zinc oxide (IGZO) is desirable in the viewpoint of the contact resistance, mobility, and transparency.

Figure 3:
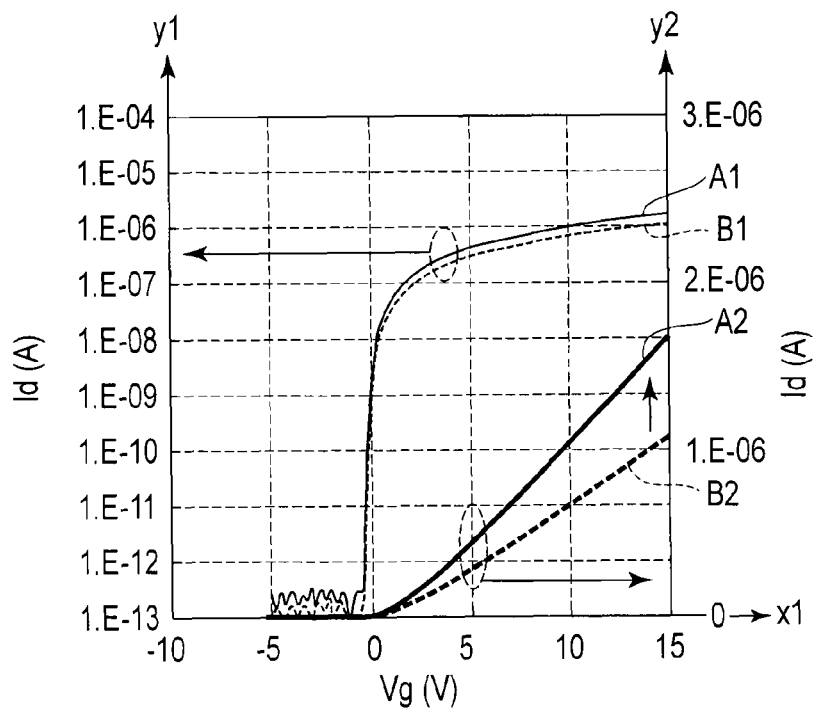
FIG. 3 is a graph illustrating a change in drain current (Id) in accordance with gate voltage (Vg) in each of the thin-film transistor shown in FIG. 2 and a thin-film transistor of a comparative example.

FIG. 3 is a graph showing the change in drain current (Id) in accordance with the gate voltage (Vg) in each of the thin-film transistor TR of the embodiment, and a thin-film transistor of a comparative example.

As shown in FIG. 3, the horizontal axis x1 indicates the gate voltage Vg. The left vertical axis y1 indicates the drain current Id (expressed in logarithm). The right vertical axis y2 indicates the drain current Id (expressed in linearity). Graph A1 and graph A2 show the characteristics of the drain current Id—gate voltage Vg of the thin-film transistor TR of the embodiment. These graphs show the results of simulation of the performance of the thin-film transistor TR carried out when the ratio of the first channel length L1 of the first channel region 12C to the second channel length L2 of the second channel region 18C is set to 5:3. Graph B1 and graph B2 show the characteristics of the drain current Id—gate voltage Vg of the thin-film transistor of the comparative example. The thin-film transistor of the comparative example is a thin-film transistor obtained by eliminating the top-gate thin-film transistor structure formed from the first semiconductor layer 12, from the structure of the embodiment. The graph A1 and the graph B1 each show the plot of the drain current Id (expressed in logarithm) in accordance with the gate voltage Vg, and the value thereof is read from the vertical axis y1. Further, the graph A2 and graph B2 each show the plot of the drain current Id (expressed in linearity) in accordance with the gate voltage Vg, and the value thereof is read from the vertical axis y2.

According to the graph A1 and the graph B1, the threshold voltage Vth of the thin-film transistor TR did not rise from that of the comparative example. This result shows that the thin-film transistor TR was operating while taking the second threshold voltage Vth2 as the threshold voltage Vth. That is, in such a thin-film transistor TR, the load on the gate line G and gate electrode WG did not increase. Further, the graph A1 does not show hump characteristic. According to the graph A2 and graph B2, the drain current of the thin-film transistor TR of this embodiment is approximately 1.6 times that of the comparative example. Note that the channel width of the first channel region 12C is the same as the channel width of the second channel region 18C, but the first channel length L1 of the first channel region 12C is not the same as the second channel length L2 of the second channel region 18C, the drain current became about 1.6 times as described above, and did not become twice. As indicated above, the embodiment can provide thin-film transistors TR with high performance and suppressed dispersion in characteristics.

Next, the process of manufacturing a thin-film transistor will now be described with reference to FIGS. 4 to 7. FIGS. 4 to 7 are brief sectional views illustrating a method of manufacturing the thin-film transistor TR of the embodiment.

As shown in FIG. 4, when manufacture of the thin-film transistor TR is started, first, an oxide semiconductor film of, for example, IGZO, is formed on the first insulating substrate 10 using a sputtering process or the like. Then, the oxide semiconductor film is patterned into an island form, thus forming a first oxide semiconductor layer CO1.

FIG. 5 shows a state in a stage up to where the gate electrode WG is formed. As shown in FIG. 5, an insulating film is formed on the first insulating substrate 10 and the first oxide semiconductor layer CO1. Further, a metallic film is formed on the insulating film. The insulating film and the metallic film are formed by, for example, sputtering process, a plasma-chemical vapor deposition (CVD) method, or the like. After that, the insulating film and the metallic film are collectively patterned into an island form, and thus the first insulating film 14 is formed from the insulating film and the gate electrode WG is formed from the metallic film. Then, here, the first oxide semiconductor layer CO1 may be subjected to a process to reduce the resistance thereof, using the first insulating film 14 as a mask. For example, an exposed portion of the first oxide semiconductor layer CO1 is subjected to reducing gas plasma process such as hydrogen plasma process. Thus, the exposed portion of the first oxide semiconductor layer CO1 is reduced by reducing hydrogen plasma to lower the resistance thereof. Since the first oxide semiconductor layer CO1 in the region masked with the first insulating film 14 is not reduced, and therefore a comparatively high resistance state is maintained. As a result, the first semiconductor layer 12 is formed from the first oxide semiconductor layer CO1. Note that the method of lowering the resistance is not particularly limited, but, reduction by UV-light irradiation and the like may be selected as well in accordance with necessity.

In such a process, the patterning of the insulating film and the lowering of the resistance of the first oxide semiconductor layer CO1 can be performed at the same time. More specifically, an insulating film is patterned by reactive ion etching (RIE), which is a type of plasma dry etching. Here, a gas containing, for example, fluorine or hydrogen, which has reducing properties, is used as the etching gas. Examples of such etching gas are a gaseous mixture of methane tetrafluoride (CF4) and oxygen, and a gaseous mixture of perfluorocyclobutane (C4F8), hydrogen and argon. With these materials, while patterning the insulating film and the metallic film, the first oxide semiconductor layer CO1 is reduced by fluorine plasma and hydrogen plasma. With such a gas used for dry etching, the first oxide semiconductor layer CO1 may not be fully processed to have a lower resistance. However, when the resistance of the first oxide semiconductor layer CO1 is lowered as auxiliary measures at the time of dry etching, the burden of processing for achieving the lower resistance, which is carried out henceforth, can be reduced.

FIG. 6 shows the state where the process has proceeded to the formation of the second oxide semiconductor layer CO2. As shown in FIG. 6, after forming the gate electrode WG, the second insulating film 16 is formed on the first insulating substrate 10 by the plasma CVD method or like, such as to cover (completely bury) the first insulating substrate 10, the first semiconductor layer 12 and the gate electrode WG. Then, the first contact hole CH1 and the second contact hole CH2 are formed in the second insulating film 16. Subsequently, a metal oxide film such as of IGZO is formed on the second insulating film 16 including the insides of the first contact hole CH1 and the second contact hole CH2. After that, the metal oxide is patterned into an island form and the second oxide semiconductor layer CO2 is formed regions thereof which opposes the first semiconductor layer 12.

In the embodiment, photolithography is used to form the first oxide semiconductor layer CO1 and the second oxide semiconductor layer CO2. In this case, it is possible to use the same photomask in the formation of the first oxide semiconductor layer CO1 and the second oxide semiconductor CO2. That is, the photomask can be shared in the formations of the first oxide semiconductor layer CO1 and the second oxide semiconductor CO2, thus contributing to reduction of the manufacturing cost. Note that the first oxide semiconductor layer CO1 and the second oxide semiconductor CO2 (substantially) coincide with each other in terms of size (area).

Figure 7:
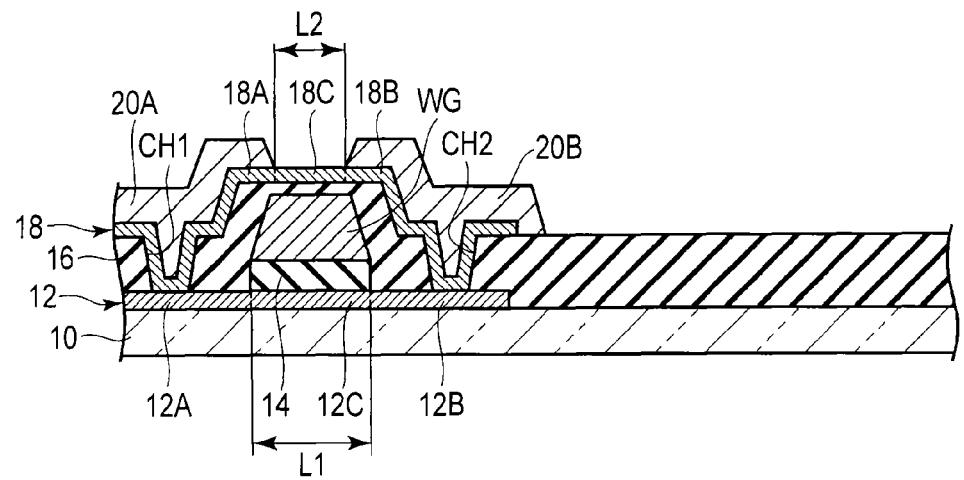
FIG. 7 is a schematic exemplary sectional view illustrating the method of manufacturing the thin-film transistor in subsequence to FIG. 6.

FIG. 7 shows the state where the process has proceeded to the formation of the low-resistance wirings 20A and 20B. As shown in FIG. 7, next, a metallic film is formed on the second insulating film 16 and the second oxide semiconductor layer CO2. Then, the metallic film is patterned so as to divide in a region which opposes the gate electrode WG, thus forming the low-resistance wirings 20A and 20B. A portion of the second oxide semiconductor layer CO2, which is not covered by the low-resistance wirings 20A and 20B forms the second channel region 18C. A region of the second oxide semiconductor layer CO2, which is in contact with the low-resistance wiring 20A forms the third region 18A, and a region of the second oxide semiconductor layer CO2, which is in contact with the second electrode 20B forms the fourth region 18B. As a result, the second semiconductor layer 18 which includes the third region 18A, the second channel region 18C and the fourth region 18B is formed.

Figure 8:
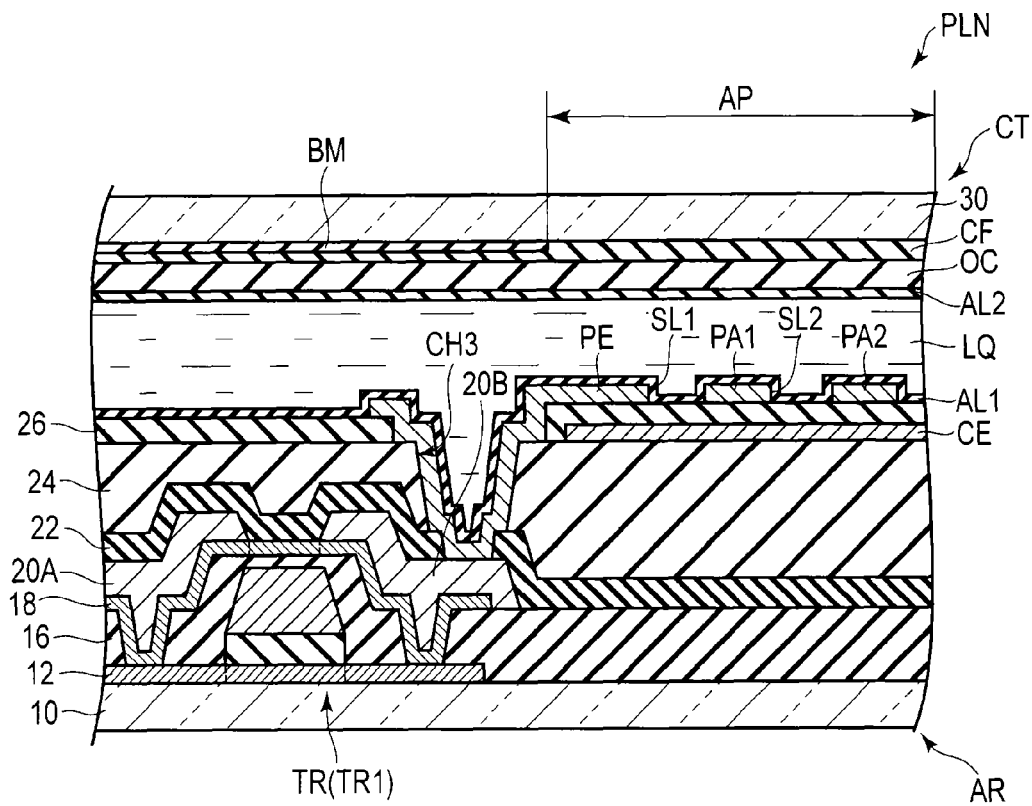
FIG. 8 is a schematic exemplary sectional view of a display device according to an example of the embodiment.

Next, a display device 1 according to an example of the embodiment will now be described. In this example, the thin-film transistor TR is applied to the first thin-film transistor TR1. FIG. 8 is a brief sectional view showing a liquid crystal display panel PLN of the display device according to the example.

As shown in FIG. 8, the liquid crystal display panel PLN employs a fringe field switching (FFS) system. But, the system of driving the liquid crystal display panel in the embodiment is not particularly limited, and can be variously modified. For example, an in-plane switching (IPS) systems other than the FFS system, a twisted nematic (TN) system, a vertical alignment (VA) system, or the like may be used as well. Such a liquid crystal display panel PLN further comprise a counter-substrate CT and a liquid crystal layer LQ in addition to the array substrate AR.

The array substrate AR further comprises a third insulating film 22, a fourth insulating film 24, a common electrode CE, a fifth insulating film 26, a pixel electrode PE and a first alignment film AL1, in addition to the members described above.

The third insulating film 22 is formed on the second insulating film 16, the second channel region 18C, the low-resistance wiring 20A and the low-resistance wiring 20B. The third insulating film 22 is formed in order to protect the second channel region 18C from oxidizing and reducing materials. Therefore, for the third insulating film 22, a material with low transmissivity to oxidizers and reducing materials such as oxygen and carbon monoxide, can be suitably employed.

The fourth insulating film 24 covers the third insulating film 22. The fourth insulating film 24 can functions as a planarizing film so as to reduce unevenness of the surface of the array substrate AR.

Therefore, it is desirable to form the fourth insulating film 24 of an organic material which is suitable for thickening the film, such as an acrylic resin.

The common electrode CE is formed on a region of the fourth insulating film 24, which corresponds to an aperture AP.

The fifth insulating film 26 is formed on the fourth insulating film 24 and the common electrode CE. The fifth insulating film 26 is formed of an inorganic material, for example, silicon oxide and silicon nitride. Note that the third contact hole CH3 is formed in a region opposing to the second electrode 20B. The third contact hole CH3 includes via-holes made through all of the third insulating film 22, the fourth insulating film 24 and the fifth insulating film 26. These via-holes are arranged to overlay one on another. With this structure, the third contact hole CH3 is made to reach even the second electrode 20B from the fifth insulating film 26.

The pixel electrode PE is formed on the fifth insulating film 26 and inside the third contact hole CH3. The pixel electrode PE opposes the common electrode CE. The pixel electrode PE is electrically connected to the second electrode 20B in the third contact hole CH3. The pixel electrode PE comprises a first slit SL1, a second slit SL2, a first partial electrode PA1 and a second partial electrode PA2 in the region opposing the common electrode CE. Note that the number of slits is not limited to two, but a desired number of slits can be formed. The pixel electrode PE and the common electrode CE are each formed of a conductive material which has light transmissivity, such as indium tin oxide (ITO) and indium zinc oxide (IZO), but they may be formed of some metal such as aluminum or tungsten, or an alloy of these materials.

The first alignment film AL1 is formed on the fifth insulating film 26 and the pixel electrode PE.

On the other hand, the counter-substrate CT comprises a second insulating substrate 30, a light-shielding layer BM, a color filter CF, an overcoat layer OC and a second alignment film AL2.

The second insulating substrate 30 is formed of a material which has light transmissivity and insulating properties, such as glass or resin.

The light-shielding layer BM is formed on the second insulating substrate 30. The light-shielding layer BM opposes the thin-film transistor TR and is not formed in a region corresponding to the aperture AP. The light-shielding layer BM is provided to suppress degradation of the display quality by mixture of colors and to prevent defused reflection of external light in the thin-film transistor TR. Therefore, the light-shielding layer BM is formed of a material with low light transmissivity and low light reflection factor.

The color filter CF is formed on the second insulating substrate and the light-shielding layer BM. The color filter CF is provided to color the light transmitted through the aperture AP into, for example, red, green and blue.

The overcoat layer OC covers the color filter CF. The overcoat layer OC functions to moderate the unevenness of the surface of the color filter CF and to planarize the surface on which the second alignment film AL2 is provided. Further, the overcoat layer OC can also function to prevent the entry of contaminants into the liquid crystal layer LQ from the color filter CF. The overcoat layer OC is formed of a transparent resin such as epoxy acrylate.

The second alignment film AL2 is formed on the overcoat layer OC. The first alignment film AL1 and the second alignment film AL2 are formed of a material exhibiting horizontally-oriented property. The first alignment film AL1 and the second alignment film AL2 described above are subjected to alignment processing for initial alignment of the liquid crystal molecules of the liquid crystal layer LQ. Examples of the alignment processing are rubbing and optical alignment.

The liquid crystal layer LQ is held between the first alignment film AL1 of the array substrate AR and the second alignment film AL2 of the counter-substrate CT. The liquid crystal molecules of the liquid crystal layer LQ are pre-tilted by the first alignment film AL1 and the second alignment film AL2 with respect to the surface of the alignment films, thus initially aligned.

Next, the operation of the liquid crystal display panel PLN will be described. In this off-state, the liquid crystal molecules of the liquid crystal layer LQ maintains their initial alignment. The off-state is a state where a potential difference is not produced between the pixel electrode PE and the common electrode CE. On the other hand, in the on-state, the liquid crystal molecules of the liquid crystal layer LQ are influenced by the electric field produced between the common electrode CE and the pixel electrode PE to change their alignment. The on-state is a state where potential difference is produced between the common electrode CE and the pixel electrode PE. The electric field is generated from a partial electrode and bent into a U-shape, then directed towards the common electrode CE through a slit.

According to the above-described example of the embodiment, the display device 1 comprising thin-film transistors with narrow characteristic variation and small occupying area can be obtained. For example, the aperture ratio of the pixels of the liquid crystal display panel PLN can be raised. Or, degradation of the display quality, caused by variation in performance among the thin-film transistors TR (the first thin-film transistors TR1) can be suppressed. Or, the technology of this example can contribute to the miniaturization (reduction of occupying area) of the source driver SD and the gate driver GD.

Figure 9:
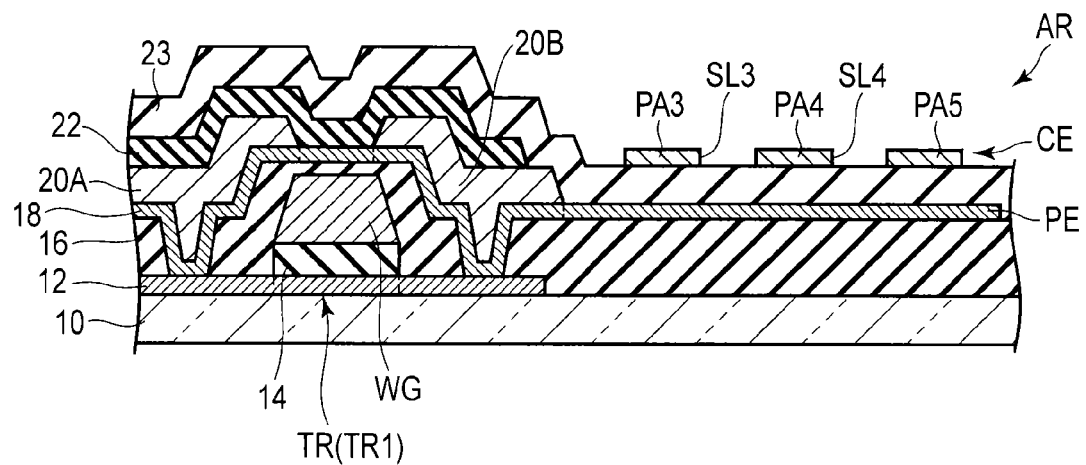
FIG. 9 is a schematic exemplary sectional view of an array substrate of a display device according to modification 1 of the embodiment.

Next, a display device 1 according to modification 1 of the embodiment will now be described. In modification 1 as well, the thin-film transistor TR is applied to the first thin-film transistor TR1. FIG. 9 is a brief sectional view showing an array substrate of a liquid crystal display panel of the display device according to modification 1. Note that here only the principal part of the array substrate AR, which is required for explanation is illustrated.

As shown in FIG. 9, the array substrate AR comprises the thin-film transistor TR illustrated in FIG. 2 on the first insulating substrate 10. A pixel electrode PE is provided on the second insulating film 16. The pixel electrode PE is formed in a layer of the same level as that of the second semiconductor layer 18, is formed of the same material as that of the second semiconductor layer 18, and is formed integral with the second semiconductor layer 18. The pixel electrode PE is formed of, for example, a conductive oxide which has light transmissivity. In this case, the array substrate AR may be, for example, exposed to reducing gas, so as to process the exposed portion of the pixel electrode PE to have lower resistance after forming the third insulating film 22.

The third insulating film 22 is formed on the low-resistance wirings 20A and 20B and the pixel electrode PE. The third insulating film 22 covers the second channel region 18C and also covers partially the first electrodes 20A and the second electrodes 20B. An interlayer capacitance film 23 is provided to cover the second insulating film 16, the pixel electrode PE, the first electrode 20A, the second electrode 20B and the third insulating film 22. The common electrode CE is formed on the interlayer capacitance film 23 and opposes the pixel electrode PE. The common electrode CE comprises a third slit SL3, a fourth slit SL4, a third partial electrode PA3, a fourth partial electrode PA4 and a fifth partial electrode PA5 in a region corresponding to the aperture AP. With this structure, the electric field is produced from the common electrode CE and directed towards the pixel electrode PE.

Also in modification 1, an effect similar to that of the above-described example can be obtained. Further, as compared to the example shown in FIG. 8, the number of steps involved in the manufacturing process is decreased in modification 1, and therefore the manufacturing cost can be suppressed.

Figure 10:
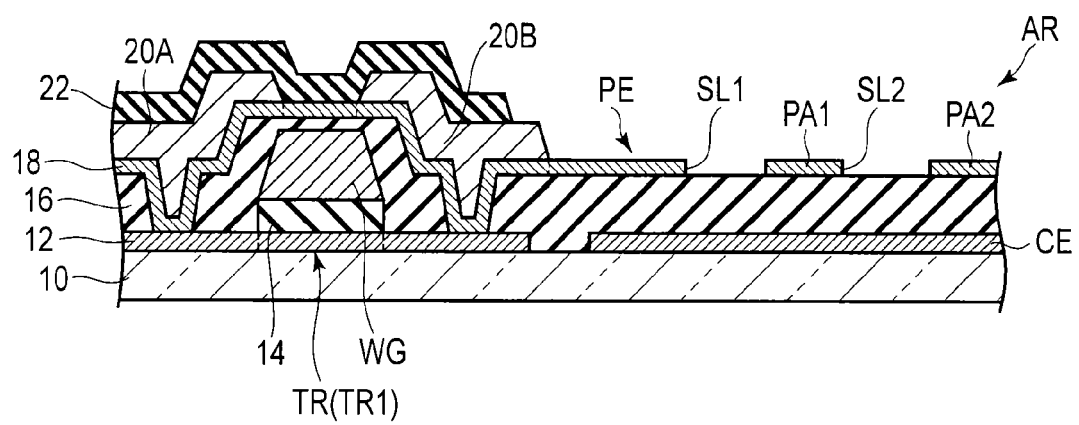
FIG. 10 is a schematic exemplary sectional view of an array substrate of a display device according to modification 2 of the embodiment.

Next, a display device 1 according to modification 2 of the embodiment will be described. In modification 2 as well, the thin-film transistor TR is applied to the first thin-film transistor TR1. FIG. 10 is a brief sectional view showing an array substrate of a liquid crystal display panel of the display device according to modification 2. Note that here only the principal part of the array substrate AR, which is required for explanation is illustrated.

As shown in FIG. 10, the array substrate AR comprises the thin-film transistor TR illustrated in FIG. 2 on the first insulating substrate 10. The common electrode CE is provided above the first insulating substrate 10. The common electrode CE is formed in a layer of the same level as that of the first semiconductor layer 12, is formed of the same material as that of the first semiconductor layer 12, and is located to maintain a gap from the first semiconductor layer 12. The common electrode CE is located in a region corresponding to the aperture AP. The pixel electrode PE opposes the common electrode CE while interposing the second insulating film 16 therebetween. The pixel electrode PE is formed in a layer of the same level as that of the second semiconductor layer 18, is formed of the same material as that of the second semiconductor layer 18, and is formed integral with the second semiconductor layer 18. In this case, the pixel electrode PE is formed of, for example, an oxide having light transmissivity. The pixel electrode PE comprises a first slit SL1, a second slit SL2, a first partial electrode PA1 and a second partial electrode PA2 in a region corresponding to the aperture AP. With this structure, the electric field is produced from the pixel electrode PE and directed towards the common electrode CE.

Also in modification 2, an effect similar to that of the above-described example can be obtained. Further, as compared to the example shown in FIG. 8 and modification 1 shown in FIG. 9, the number of steps involved in the manufacturing process is decreased in modification 2, and therefore the manufacturing cost can be suppressed.

As described above, according to the embodiments, the display device comprising thin-film transistors with narrow characteristic variation and small occupying area can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, it suffices only if the thin-film transistor TR satisfies the relationship of at least T16<T14 among the channel lengths (L1, L2), the channel widths and gaps T14 and T16, discussed above. Thus, a thin-film transistor TR with narrow characteristic variation and small occupying area can be obtained. Here, it is preferable that the thin-film transistor TR satisfy the relationship of L2≤L1. The channel width of the thin-film transistor TR is not particularly limited, but still it is desirable that the second channel width of the second channel region 18C be equal to or greater than the first channel width of the first channel region 12C. Note that it is more desirable, in order to secure the channel width of the thin-film transistor TR, that the first channel width be the same as the second channel width.

Alternatively, it suffices only if the thin-film transistor TR satisfies the relationship of at least L2<L1 among the channel lengths (L1, L2), the channel widths and gaps T14 and T16, discussed above. The gate electrode WG comprises a bottom surface WGb and an upper surface WGa having an area smaller than that of the bottom surface WGb, and is formed to have a forward tapered shape. With this structure, a thin-film transistor TR with narrow characteristic variation and small occupying area can be obtained. In this case, it is more desirable that the thin-film transistor TR satisfy the relationship of T16≤T14. The channel width of the thin-film transistor TR is not particularly limited, but still it is desirable that the second channel width of the second channel region 18C be equal to or greater than the first channel width of the first channel region 12C. Note that it is more desirable, in order to secure the channel width of the thin-film transistor TR, that the first channel width be the same as the second channel width.

Alternatively, it suffices only if the thin-film transistor TR satisfies the relationship that the second channel width exceeds the first channel width, among the channel lengths (L1, L2), the channel widths and gaps T14 and T16, discussed above. With this condition, a thin-film transistor TR with narrow characteristic variation and small occupying area can be obtained. In this case, it is more desirable that the thin-film transistor TR satisfy the relationship of T16≤T14. It is still more desirable that the thin-film transistor TR satisfy the relationship of L2≤L1.

The embodiments provided above disclose liquid crystal display devices as the display device. But these embodiments are applicable to all types of flat-panel or flexible display devices, such as organic electroluminescent (EL) display devices, other types of luminescent display devices and electronic-paper display devices including electrophoresis elements, etc. Moreover, it is only natural that the above-provided embodiments are applicable to display devices of small to middle sizes to even large-sizes, without any particular limitations.

Further, the thin-film transistors TR described above are applicable to semiconductor devices of those other than display devices, that is, for example, various types of memories or various types of sensors.

What is claimed is:
1. A display device comprising thin-film transistor, the thin-film transistor comprising:
a first semiconductor layer including a first region, a second region and a first channel region located between the first region and the second region, the first channel region having a first channel length;
a first insulating film formed on the first channel region of the first semiconductor layer;
a gate electrode formed on the first insulating film to oppose the first channel region;
a second insulating film formed on the gate electrode;
a second semiconductor layer formed on the second insulating film to oppose the first semiconductor layer, and including a third region electrically connected to the first region, a fourth region electrically connected to the second region and a second channel region located between the third region and the fourth region to oppose the gate electrode;
a first electrode located above the second semiconductor layer and contacting with the third region; and
a second electrode located above the second semiconductor layer, separated from the first electrode and contacting with the fourth region,
wherein
a gap between a bottom surface of the gate electrode and an upper surface of the first channel region, which oppose each other, is larger than a gap between an upper surface of the gate electrode and a bottom surface of the second channel region, which oppose each other, and
the first channel length is equivalent to a distance between a pair of opposing sides, in a direction from the first region to the second region, of the bottom surface of the gate electrode.
2. The display device of claim 1, wherein
the first semiconductor layer and the second semiconductor layer are formed of an oxide material containing at least one of indium, gallium and zinc.
3. The display device of claim 2, wherein
the first semiconductor layer and the second semiconductor layer are indium-gallium-zinc oxide.
4. The display device of claim 2, wherein
the first channel region is an overlap region which the first insulating film overlaps,
the first region and the second region are non-overlap regions off from the first insulating film, and
a concentration of a reducing element of each of the first region and the second region is higher than a concentration of a reducing element of the first channel region.
5. The display device of claim 1, further comprising:
a third insulating film formed on the first electrode and the second electrode;
a common electrode formed on the third insulating film;
a fourth insulating film formed on the common electrode; and
a pixel electrode formed on the fourth insulating film to oppose the common electrode and electrically connected to the second electrode.
6. The display device of claim 5, further comprising:
a liquid crystal layer to which an electric field produced between the common electrode and the pixel electrode is applied.
7. The display device of claim 1, further comprising:
a pixel electrode formed in a layer of a same level as that of the second semiconductor layer and of a same material as that of the second semiconductor layer, integrally therewith;
a third insulating film formed on the first electrode, the second electrode and the pixel electrode; and
a common electrode formed on the third insulating film to oppose the pixel electrode.
8. The display device of claim 7, further comprising:
a liquid crystal layer to which an electric field produced between the common electrode and the pixel electrode is applied.
9. The display device of claim 1, further comprising:
a common electrode formed in a layer of a same level as that of the first semiconductor layer and of a same material as that of the first semiconductor layer, and separated from the first semiconductor layer; and
a pixel electrode formed in a layer of a same level as that of the second semiconductor layer and of a same material as that of the second semiconductor layer, integrally therewith to oppose the common electrode across the second insulating film.
10. The display device of claim 9, further comprising:
a liquid crystal layer to which an electric field produced between the common electrode and the pixel electrode is applied.
11. A display device comprising thin-film transistor, the thin-film transistor comprising:
a first semiconductor layer including a first region, a second region and a first channel region located between the first region and the second region, the first channel region having a first channel length;
a first insulating film formed on the first channel region of the first semiconductor layer;
a gate electrode formed on the first insulating film to oppose the first channel region;
a second insulating film foil led on the gate electrode;
a second semiconductor layer formed on the second insulating film to oppose the first semiconductor layer, and including a third region electrically connected to the first region, a fourth region electrically connected to the second region and a second channel region located between the third region and the fourth region to oppose the gate electrode;
a first electrode located above the second semiconductor layer and contacting with the third region; and
a second electrode located above the second semiconductor layer, separated from the first electrode and contacting with the fourth region,
wherein
the gate electrode comprises a bottom surface opposing the first channel region, and an upper surface opposing the second channel region and having an area smaller than that of the bottom surface, and is formed into a forward tapered shape, and
the first channel length is equivalent to a distance between a pair of opposing sides, in a direction from the first region to the second region, of the bottom surface of the gate electrode.

12. The display device of claim 11, wherein
a gap between a bottom surface of the gate electrode and an upper surface of the first channel region, which oppose to each other, is equal to or larger than a gap between an upper surface of the gate electrode and a bottom surface of the second channel region, which oppose to each other.

13. The display device of claim 11, wherein
the first semiconductor layer and the second semiconductor layer are formed of an oxide material containing at least one of indium, gallium and zinc.

14. The display device of claim 13, wherein
the first semiconductor layer and the second semiconductor layer are indium-gallium-zinc oxide.

15. The display device of claim 13, wherein
the first channel region is an overlap region which the first insulating film overlaps,
the first region and the second region are non-overlap regions off from the first insulating film, and
a concentration of a reducing element of each of the first region and the second region is higher than a concentration of a reducing element of the first channel region.

16. The display device of claim 11, further comprising:
a third insulating film formed on the first electrode and the second electrode;
a common electrode formed on the third insulating film;
a fourth insulating film formed on the common electrode; and
a pixel electrode formed on the fourth insulating film to oppose the common electrode and electrically connected to the second electrode.

17. The display device of claim 16, further comprising:
a liquid crystal layer to which an electric field produced between the common electrode and the pixel electrode is applied.

18. The display device of claim 11, further comprising:
a pixel electrode formed in a layer of a same level as that of the second semiconductor layer and of a same material as that of the second semiconductor layer, integrally therewith;
a third insulating film formed on the first electrode, the second electrode and the pixel electrode; and
a common electrode formed on the third insulating film to oppose the pixel electrode.

19. The display device of claim 18, further comprising:
a liquid crystal layer to which an electric field produced between the common electrode and the pixel electrode is applied.

20. The display device of claim 11, further comprising:
a common electrode formed in a layer of a same level as that of the first semiconductor layer and of a same material as that of the first semiconductor layer, and separated from the first semiconductor layer; and
a pixel electrode formed in a layer of a same level as that of the second semiconductor layer and of a same material as that of the second semiconductor layer, integrally therewith to oppose the common electrode across the second insulating film.

* * * * *